United States Patent
Qiao et al.

(10) Patent No.: US 12,007,309 B2
(45) Date of Patent: Jun. 11, 2024

(54) NON-CONTACT DYNAMIC STRAIN FIELD MEASURING METHOD AND SYSTEM FOR ROTATING BLADE

(71) Applicant: XI'AN JIAOTONG UNIVERSITY, Shaanxi (CN)

(72) Inventors: Baijie Qiao, Shaanxi (CN); Chunyan Ao, Shaanxi (CN); Xuefeng Chen, Shaanxi (CN); Hongrui Cao, Shaanxi (CN); Yu Sun, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 304 days.

(21) Appl. No.: 17/325,209

(22) Filed: May 20, 2021

(65) Prior Publication Data
US 2021/0389207 A1 Dec. 16, 2021

Related U.S. Application Data

(63) Continuation of application No. PCT/CN2020/080644, filed on Mar. 23, 2020.

(30) Foreign Application Priority Data

Mar. 22, 2019 (CN) .......................... 201910226767.9

(51) Int. Cl.
*G01M 7/02* (2006.01)
*G01B 21/32* (2006.01)
(Continued)

(52) U.S. Cl.
CPC .............. *G01M 7/02* (2013.01); *G01B 21/32* (2013.01); *G01M 15/14* (2013.01); *G06F 30/23* (2020.01)

(58) Field of Classification Search
None
See application file for complete search history.

(56) References Cited

U.S. PATENT DOCUMENTS

| 7,574,338 B1 | 8/2009 | Kaul | |
|---|---|---|---|
| 2015/0199805 A1* | 7/2015 | Hatcher, Jr. | ............. H04N 7/18 348/135 |

FOREIGN PATENT DOCUMENTS

| CN | 104794284 A | 7/2015 |
|---|---|---|
| CN | 107103111 A | 8/2017 |

(Continued)

OTHER PUBLICATIONS

International Search Report of PCT/CN2020/080644.
(Continued)

*Primary Examiner* — Matthew G Marini

(57) ABSTRACT

The present invention discloses a non-contact dynamic strain field measuring method and system for a rotating blade. The method includes the following steps: establishing a three-dimensional finite element model of a to-be-measured rotating blade, and extracting modal parameters of the three-dimensional finite element model; determining the number and axial mounting positions of blade tip timing sensors; constructing a conversion matrix of finite measuring point displacement and an overall strain field; and acquiring blade tip finite position displacement of the rotating blade based on the blade tip timing sensors, and acquiring, by a dynamic strain, dynamic strains of the rotating blade at any moment, on any position and in any direction based on modal processing of the conversion matrix.

4 Claims, 10 Drawing Sheets

(51) Int. Cl.
　　　*G01M 15/14*　　　(2006.01)
　　　*G06F 30/23*　　　(2020.01)

(56) References Cited

FOREIGN PATENT DOCUMENTS

| CN | 107515980 A | * | 12/2017 | ........... G06F 30/392 |
|---|---|---|---|---|
| CN | 107515980 A | | 12/2017 | |
| CN | 107741312 A | | 2/2018 | |
| CN | 109870134 A | | 6/2019 | |

OTHER PUBLICATIONS

Written Opinion of PCT/CN2020/080644.
Li, Gang. Research for No-contact Measurement Method of Blade Dynamic Stress Based on Tip-timing. Chinese Master's Theses Full-Text Database, Engineering Science & Technology II, No. 11. Nov. 15, 2017 (Nov. 15, 2017). ISSN: 1674-0246. pp. 7-14 and 27-44, and figures 2-1, 2-2, 2-5 and 4-5.
Chen, Shuai. Prediction of Full-field S train Using Vibration Displacement of Limited Points. Chinese Master's Theses Full-Text Database, Engineering Science & Technology II, No. 01. Jan. 15, 2019 (Jan. 15, 2019). ISSN: 1674-0246.

* cited by examiner

NON-CONTACT DYNAMIC STRAIN FIELD MEASURING METHOD AND SYSTEM FOR ROTATING BLADE

CROSS-REFERENCE TO RELATED APPLICATIONS

The present application is filed based on and claims priorities from Chinese patent application No. CN2019102267679 filed on Mar. 22, 2019 and PCT/CN2020/080644 filed on Mar. 23, 2020, which are incorporated herein by reference in its entirety.

TECHNICAL FIELD

The present invention belongs to the technical field of non-contact vibration tests of blades of rotating machinery and in particular relates to a non-contact dynamic strain field measuring method and system for a rotating blade.

BACKGROUND The integrity of a high-speed rotating blade directly affects the safe operation of an overall structure of an aircraft engine, and due to the affects of factors such as harsh working environments and strong alternating loads, vibration fatigue cracks are very easy to generate in a service process of the high-speed rotating blade to result in serious accidents. A main failure mode of a blade of the aircraft engine is high-cycle fatigue resulted from over-high blade vibration. The high-cycle fatigue of the blade is mainly caused by a dynamic stress resulted from various aerodynamic loads and mechanical loads, massive cycles may be accumulated within a short time to generate the fatigue cracks, and particularly, the fatigue failure of the blade is easily caused by the dynamic stress when the resonance of the blade happens. In research and production processes of the aircraft engine, the vibration of the blade is required to be measured in order to master the vibration characteristic of the blade. For a long time, the measurement for a dynamic strain of the blade of the aircraft engine is realized in a way of pasting strain gauges on the surface of a rotating blade, by which dynamic strains of finite positions of finite blades can only be measured, the reliability is relatively poor, the continuous working time is relatively short, and particularly, only few strain gauges can acquire effective information even if a great number of strain gauges are arranged on a turbine blade in a high-temperature environment, and therefore, the survival rate of the strain gauges is very low. Due to the characteristic of high-speed rotation of the blade of the aircraft engine, non-contact measurement based on blade tip timing becomes the development direction of researches in the field of blade vibration tests. Sensing blade tip vibration information by virtue of a sensor mounted close to the inner side of a casing is called "blade tip timing". A current blade tip timing (BTT) technology is concerned by aircraft engine manufacturing and testing magnates, for example, the American Air Force's Arnold Engineering Development Center (AEDC) has brought out a non-intrusive stress measurement system (NSMS) of a blade.

The above-mentioned information disclosed in the background part is merely intended to help understand the background of the present invention, and therefore, the information may contain information not constructing the prior art known by the ordinary skilled in the art at home.

SUMMARY

With specific to problems existing in the prior art, the present invention provides a non-contact dynamic strain field measuring method and system for a rotating blade, so that the problem that the blade tip timing technology can only be used for measuring finite displacement and a finite strain of a blade tip is solved, and the measuring method and system have the advantage of simultaneously reconstructing dynamic strains of all nodes on the surface of and inside the rotating blade.

Non-contact measurement based on blade tip timing becomes a most promising replacing method for contact strain measurement, vibration information such as vibration frequencies, amplitude values, excitation orders and resonance regions of all blades may be measured by blade tip timing, and furthermore, the estimation of dynamic strains on specific positions of a blade under specific modal vibration may be realized by virtue of a finite element model. Dynamic strain inversion based on non-contact measurement is a key to decide whether the blade tip timing can replace traditional strain gauge measurement. The working environment of a rotating blade is harsh, the vibration of the blade under the excitation of a complex load is resulted from multimodal superposition, at the moment, the position of the maximum dynamic stress point is unfixed, and no fixed conversion relationships exist between a displacement and a strain; and the current dynamic strain reconstruction method is only suitable for estimating the dynamic strain of the blade under single-modal vibration, but cannot realize the reconstruction of a dynamic strain field under multimodal vibration at any moment. Therefore, an overall strain field of the rotating blade is reconstructed by vibration inversion of a finite measuring point based on a modal reduction and expansion theory, and the core is to construct a blade displacement-strain conversion matrix.

The purpose of the present invention is realized by adopting the following technical solution, and a non-contact dynamic strain field measuring method for a rotating blade includes the following steps:

in the first step, establishing a three-dimensional finite element model of a to-be-measured rotating blade, and extracting modal parameters of the three-dimensional finite element model;

in the second step, determining the number and axial mounting positions of blade tip timing sensors;

in the third step, constructing a conversion matrix of finite measuring point displacement and an overall strain field;

in the fourth step, acquiring blade tip finite position displacement of the rotating blade based on the blade tip timing sensors; and in the fifth step, acquiring, by a dynamic strain, dynamic strain measurement of the rotating blade at any moment, on any position and in any direction based on modal processing of the conversion matrix.

In the first step of the method, first $n_m$ order modal parameters: a modal frequency $f_i$, a displacement modal shape $\phi_i$ with the size being $n_{dof}\times 1$ and a strain modal shape $\psi_i$ with the size being $2n_{dof}\times 1$, of the three-dimensional finite element model are extracted by modal analysis, and a full-field displacement modal shape matrix, $\Phi=[\phi_1, \phi_2, \ldots, \phi_{n_m}]$ with the size being $n_{dof}\times n_m$, of the rotating blade and a full-field strain modal shape matrix, $\psi=[\psi_1, \psi_2, \ldots, \psi_{n_m}]$ with the size being $2n_{dof}\times n_m$, of the rotating blade are constructed, wherein $n_m$ represents for a modal number, i represents for a modal order, $n_{dof}$ represents for the number of degrees of freedom of the finite element model of the rotating blade, $n_{dof}=3n_n$, and $n_n$ represents for the number of nodes of the finite element model of the rotating blade.

In the first step of the method, strains of each node of the finite element model of the rotating blade include six strain components in total, including three positive strains $\varepsilon_x$, $\varepsilon_y$, $\varepsilon_z$ and three shearing strains $\gamma_{xy}$, $\gamma_{yz}$, $\gamma_{xz}$.

In the second step of the method, the number $n_d$ of axial blade tip timing measuring points of the rotating blade is larger than or equal to the number $n_m$ of modes.

In the second step of the method, a displacement modal shape capable of mounting the blade tip timing sensors in an axial direction of a blade tip of the blade is extracted, and a measuring point selection matrix, $\Phi_p = [\phi'_1, \phi'_1, \ldots, \phi'_{n_m}]$ with the size being $n_c \times n_m$, about the displacement modal shape is constructed, wherein $m_c$ represents for the number of finite element grid nodes of the blade tip of the blade, and each node selects a circumferential displacement modal shape; $n_d$ measuring points are randomly selected from the measuring point selection matrix $\Phi_p$ to construct a measuring point displacement modal shape matrix $\Phi_d$ with the size being $n_d \times n_m$, and the condition number $\kappa$ of the matrix is calculated; and a random process is repeated for R times, and a measuring point layout when the condition number $\kappa$ of the matrix is minimum is selected therefrom.

In the third step of the method, a conversion matrix $T = \psi \Phi_d^\dagger$ with the size being $2n_{do} \times n_d$ is constructed, wherein $\Phi_d^\dagger = [\Phi_d^T \Phi_d]^{-1} \Phi_d^T$ represents for the inversion of the measuring point displacement modal shape matrix $\Phi_d$; the superscript † represents for the inversion of the matrix; and the superscript T represents for the transposition of a vector.

In the fourth step of the method, displacement signals $u(t) = [u_1(t), u_2(t), \ldots, u_{n_d}(t)]^T$ on $n_d$ positions in an axial direction of the rotating blade within t moments are acquired by a blade tip timing non-contact measuring system, wherein $u_j(t)$ represents for a signal actually measured by the $j(j=1, \ldots, n_d)$th blade tip timing sensor.

In the fifth step of the method, based on the conversion matrix T and the displacement signals u(t) measured by blade tip timing, strains of all nodes on the surface of and inside the rotating blade within the t moment are calculated according to a formula $S(t) = Tu(t)$ to obtain $S(t) = [\varepsilon_{1,x}, \varepsilon_{1,y}, \varepsilon_{1,z}, \gamma_{1,xy}, \gamma_{1,yz}, \gamma_{1,xz}, \ldots, \varepsilon_{i,x}, \varepsilon_{i,y}, \varepsilon_{i,z}, \gamma_{i,xy}, \gamma_{i,yz}, \gamma_{i,xz}, \ldots, \varepsilon_{n_n,x}, \varepsilon_{n_n,y}, \varepsilon_{n_n,z}, \gamma_{n_n,xy}, \gamma_{n_n,yz}, \gamma_{n_n,xz}]^T$, and the strains S(t) include positive strains and shearing strains, wherein $\varepsilon_{i,x}$ represents for a positive strain of the $i^{th}$ node of the finite element model of the blade in an x direction, $\varepsilon_{i,y}$ represents for a positive strain of the $i^{th}$ node of the finite element model of the blade in a y direction, $\varepsilon_{i,z}$ represents for a positive strain of the $i^{th}$ node of the finite element model of the blade in a z direction, $\gamma_{i,xy}$ represents for a shearing strain of the $i^{th}$ node of the finite element model of the blade in an x-y direction, $\gamma_{i,yz}$ represents for a shearing strain of the $i^{th}$ node of the finite element model of the blade in a y-z direction, and $\gamma_{i,xz}$ represents for a shearing strain of the $i^{th}$ node of the finite element model of the blade in an x-z direction.

In the fifth step of the method, the modal processing is based on modal reduction and expansion of the strain modal shape.

On the other hand of the present invention, a measuring system for implementing the method includes:

a plurality of blade tip timing sensors arranged on a rotating blade casing;

a blade tip timing vibration measuring module connected with the blade tip timing sensors so as to measure displacement signals $u(t) = [u_1(t), u_2(t), \ldots, u_{n_d}(t)]^T$ on $n_d$ positions in an axial direction of the rotating blade within t moments; and a calculation unit connected with the blade tip timing vibration measuring module, and the calculation unit including:

a modal analysis module configured to perform modal analysis based on a three-dimensional finite element model of a to-be-measured rotating blade so as to acquire a displacement modal shape $\phi_i$ of first $n_m$ order modal frequency $f_i$ of the rotating blade and construct a full-field displacement modal shape matrix $\Phi = [\phi_1, \phi_2, \ldots, \phi_{n_m}]$ of the rotating blade;

a measuring point optimization module configured to optimize the number of measuring points of the blade tip timing sensors arranged on the rotating blade, wherein a measuring point selection matrix $\Phi_p = [\phi'_1, \phi'_1, \ldots, \phi_{n_m}]$ is constructed based on a displacement modal shape capable of mounting the blade tip timing sensors of the rotating blade, $n_d$ measuring points are randomly selected from the measuring point selection matrix $\Phi_p$ to construct a measuring point displacement modal shape matrix $\Phi_d$ with the size being $n_d \times n_m$, the condition number $\kappa$ of the matrix is calculated, a random process is repeated for R times, and a measuring point layout when the condition number $\kappa$ of the matrix is minimum is selected therefrom;

a conversion matrix calculation module configured to construct a conversion matrix of finite measuring point displacement of the blade tip and strains of all nodes in a full field; and a strain field reconstruction module configured to calculate strains of all nodes on the surface of and inside the rotating blade within the t moments according to a formula $S(t) = Tu(t)$ to obtain $S(t) = [\varepsilon_{1,x}, \varepsilon_{1,y}, \varepsilon_{1,z}, \gamma_{1,xy}, \gamma_{1,yz}, \gamma_{1,xz}, \ldots, \varepsilon_{i,x}, \varepsilon_{i,y}, \varepsilon_{i,z}, \gamma_{i,xy}, \gamma_{i,yz}, \gamma_{i,xz}, \ldots, \varepsilon_{n_n,x}, \varepsilon_{n_n,y}, \varepsilon_{n_n,z}, \gamma_{n_n,xy}, \gamma_{n_n,yz}, \gamma_{n_n,xz}]^T$, wherein the strains S(t) include positive strains and shearing strains.

Beneficial Effects:

By using the non-contact dynamic strain field measuring method for the rotating blade, provided by the present invention, the measurement of the overall dynamic strain field of the rotating blade can be realized by only virtue of few blade tip timing measuring points. Not only can the measurement of the dynamic strain on the surface of the blade be realized, but also the measurement of the positive strains and the shearing strains of the nodes inside the blade can be realized. The limitation that a traditional dynamic strain inversion method based on blade tip timing can only be used for approximately reconstructing the dynamic strain of a certain point of the blade under single-modal vibration is broken by the method provided by the present invention, and a constructed displacement-strain conversion matrix is constant and has nothing to do with frequency, time, or even boundary conditions. The method provided by the present invention is capable of analyzing the distribution of dynamic strains of key points of the rotating blade within two dimensions including a time dimension and a spatial dimension, simple in calculation process and online measurement and capable of saving a great number of strain gauges. Multimodal vibration is considered in the method provided by the present invention, so that the measurement precision is high, and a reconstruction system for the dynamic strain field of the rotating blade is simple in process and easy to realize.

BRIEF DESCRIPTION OF THE DRAWINGS

By reading the detailed description in the preferred specific implementation manners hereunder, various other advantages and benefits of the present invention will become clear for the ordinary skilled in the art. Accompanying drawings of the specification are merely intended to show the preferred implementation manners, rather than to limit the present invention. Obviously, the accompanying drawings described below are only some embodiments of the present invention, and other accompanying drawings can also be acquired by the ordinary skilled in the art based on the accompanying drawings without creative effects. Moreover, the same components are marked by the same symbols in the overall accompanying drawings.

In the accompanying drawings:

FIG. 2(a) to FIG. 2(c) are schematic structural diagrams of a non-contact dynamic strain field measuring system for a rotating blade, provided by the present invention, wherein FIG. 2(a) shows a composition of a dynamic strain field reconstruction system for a rotating blade; FIG. 2(b) shows a blade tip timing vibration measuring module; and FIG. 2(c) shows a schematic diagram of axial mounting of blade tip timing sensors;

FIG. 4(a) to FIG. 4(f) are a displacement modal shape and a strain modal shape of a rotating blade in one embodiment, wherein FIG. 4(a) is a first flexural displacement shape; FIG. 4(b) is a first flexural strain shape; FIG. 4(c) is a first torsional displacement shape; FIG. 4(d) is a first torsional strain shape; FIG. 4(e) is a second flexural displacement shape; and FIG. 4(f) is a second flexural strain shape;

FIG. 6(a) and FIG. 6(b) are comparison results of dynamic strains of No. 748 nodes on a blade body in a reconstructed strain field of a rotating blade in one embodiment and a true dynamic strain, wherein FIG. 6(a) is a comparison result of three positive strain components and the true dynamic strain; and FIG. 6(b) is a comparison result of three shearing strain components and the true dynamic strain;

FIG. 7(a) and FIG. 7(b) are comparison results of dynamic strains of No. 1100 nodes on a blade root in a reconstructed strain field of a rotating blade in one embodiment and a true dynamic strain, wherein FIG. 7(a) is a comparison result of three positive strain components and the true dynamic strain; and FIG. 7(b) is a comparison result of three shearing strain components and the true dynamic strain.

The present invention is further explained below in combination with the accompanying drawings and embodiments.

DETAILED DESCRIPTION

The specific embodiments of the present invention will be described in more detail below by reference to accompanying drawings 1-7(b). Although the specific embodiments of the present invention are shown in the accompanying drawings, however, it should be understood that the present invention can be implemented in various forms, but should not be limited by the embodiments described herein. On the contrary, these embodiments are provided in order to more thoroughly understand the present invention and integrally deliver the scope of the present invention to the skilled in the art.

It should be noted that some words are used in the specification and claims to denote specific components. It should be understood by the skilled in the art that a technician may call the same component with different nouns. In the specification and claims, the difference of the nouns is not used as a manner for distinguishing the components, while the functional difference of the components is used as a distinction criterion. For example, "including" or "includes" mentioned in the overall specification and claims is generally an open word so as to be explained as "including, but not being limited to". The subsequent description of the specification is a preferred implementation manner of the present invention, however, the description is intended to conform to a general principle of the specification, rather than to limit the scope of the present invention. The protective scope of the present invention should be based on the scope defined by the appended claims.

In order to facilitate understanding the embodiments of the present invention, the specific embodiments serving as examples are further explained below in combination with the accompanying drawings, and each accompanying drawing is not regarded as a limit to the embodiments of the present invention.

Figure 1:
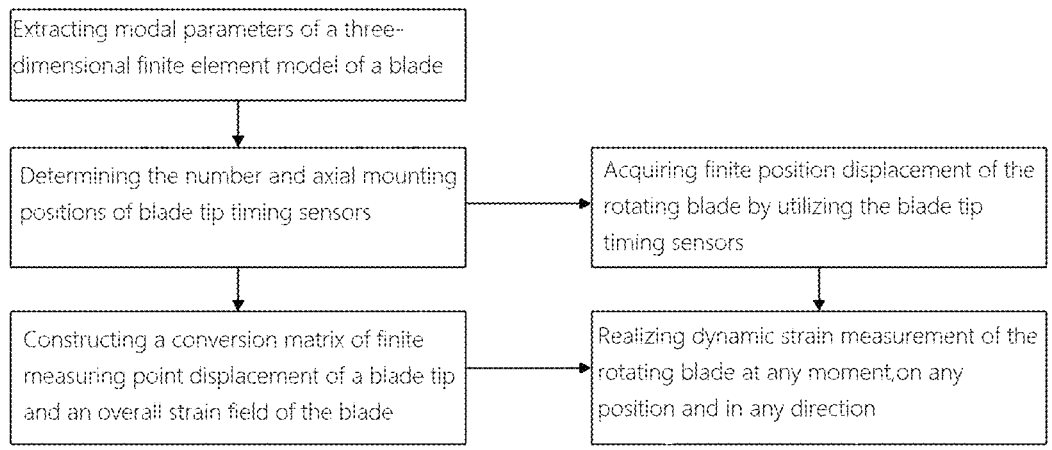
FIG. 1 is a schematic process diagram of a preferred example of a non-contact dynamic strain field measuring method for a rotating blade, provided by the present invention.

In order to realize better understanding, FIG. 1 is a working process diagram of a non-contact dynamic strain field measuring method for a rotating blade, as shown in FIG. 1, the non-contact dynamic strain field measuring method for the rotating blade includes the following steps:

in the first step S1, a three-dimensional finite element model of a to-be-measured rotating blade is established, and modal parameters of the three-dimensional finite element model are extracted;

in the second step S2, the number and axial mounting positions of blade tip timing sensors are determined;

in the third step S3, a conversion matrix of finite measuring point displacement and an overall strain field is constructed;

in the fourth step S4, blade tip finite position displacement of the rotating blade is acquired based on the blade tip timing sensors; and in the fifth step S5, dynamic strain measurement of the rotating blade at any moment, on any position and in any direction is acquired by a dynamic strain based on modal processing of the conversion matrix.

In one implementation manner of the method, in the first step S1, first $n_m$ in order modal parameters: a modal frequency $f_i$, a displacement modal shape $\phi_i$ with the size being $n_{dof} \times 1$ and a strain modal shape $\psi_i$ with the size being $2n_{dof} \times 1$, of the three-dimensional finite element model are extracted by modal analysis, and a full-field displacement modal shape matrix, $\Phi=[\phi_1, \phi_2, \ldots, \phi_{n_m}]$ with the size being $n_{dof} \times n_m$, of the rotating blade and a full-field strain modal shape matrix, $\psi=[\psi_1, \psi_2, \ldots, \psi_{n_m}]$ with the size being $2n_{dof} \times n_m$, of the rotating blade are constructed, wherein $n_m$ represents for a modal number, i represents for a modal order, $n_{dof}$ represents for the number of degrees of freedom of the finite element model of the rotating blade, $n_{dof}=3n_n$, and $n_n$ represents for the number of nodes of the finite element model of the rotating blade.

In one implementation manner of the method, in the first step S1, strains of each node of the finite element model of the rotating blade include six strain components in total, including three positive strains $\varepsilon_x$, $\varepsilon_y$, $\varepsilon_z$ and three shearing strains $\gamma_{xy}$, $\gamma_{yz}$, $\gamma_{xz}$.

In one implementation manner of the method, in the second step S2, the number $n_d$ of axial blade tip timing measuring points of the rotating blade is larger than or equal to the number $n_m$ of modes.

In one implementation manner of the method, in the second step S2, a displacement modal shape capable of mounting the blade tip timing sensors in an axial direction of a blade tip of the blade is extracted, and a measuring point selection matrix, $\Phi_p=[\phi'_1, \phi\zeta_1, \ldots, \phi'_{n_m}]$ with the size being $n_c \times n_m$, about the displacement modal shape is constructed, wherein $n_c$ represents for the number of finite element grid nodes of the blade tip of the blade, and each node selects a circumferential displacement modal shape; $n_d$ measuring points are randomly selected from the measuring point selection matrix $\Phi_p$ to construct a measuring point displacement modal shape matrix $\Phi_d$ with the size being $n_d \times n_m$, and the condition number $\kappa$ of the matrix is calculated; and a random process is repeated for R times, and a measuring point layout when the condition number $\kappa$ of the matrix is minimum is selected therefrom.

In one implementation manner of the method, in the third step S3, a conversion matrix $T=\psi\Phi_d^\dagger$ with the size being $2n_{dof} \times n_d$ is constructed, wherein $\Phi_d^\dagger=[\Phi_d^T\Phi_d]^{-1}\Phi_d^T$ represents for the inversion of the measuring point displacement modal shape matrix $\Phi^d$.

In one implementation manner of the method, in the fourth step S4, displacement signals $u(t)=[u_1(t), u_2(t), \ldots, u_{n_d}(t)]^T$ on $n_d$ positions in an axial direction of the rotating blade within t moments are acquired by a blade tip timing non-contact measuring system.

In one implementation manner of the method, in the fifth step S5, strains of all nodes on the surface of and inside the rotating blade within the t moment are calculated according to a formula $S(t)=Tu(t)$ to obtain $S(t)=[\varepsilon_{1,x}, \varepsilon_{1,y}, \varepsilon_{1,z}, \gamma_{1,xy}, \gamma_{1,yz}, \gamma_{1,xz}, \ldots, \varepsilon_{i,x}, \varepsilon_{i,y}, \varepsilon_{i,z}, \gamma_{i,xy}, \gamma_{i,yz}, \gamma_{i,xz}, \ldots, \varepsilon_{n_n,x}, \varepsilon_{n_n,y}, \varepsilon_{n_n,z}, \gamma_{n_n,xy}, \gamma_{n_n,yz}, \gamma_{n_n,xz}]^T$, and the strains S(t) include positive strains and shearing strains.

In one implementation manner of the method, wherein in the fifth step S5, the modal processing is based on modal reduction and expansion of the strain modal shape.

In order to further understand the present invention, the present invention is further described below in combination with accompanying drawings 1-7(b) and the specific embodiments, and it should be emphasized that the following description is merely exemplary, while application objects of the present invention are not limited to the following examples.

Figure 2A:
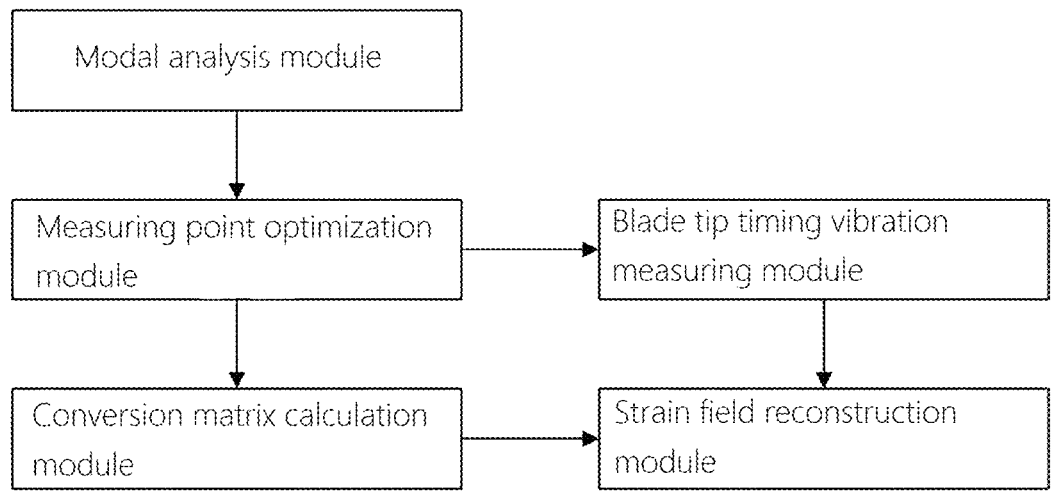
Figure 2B:
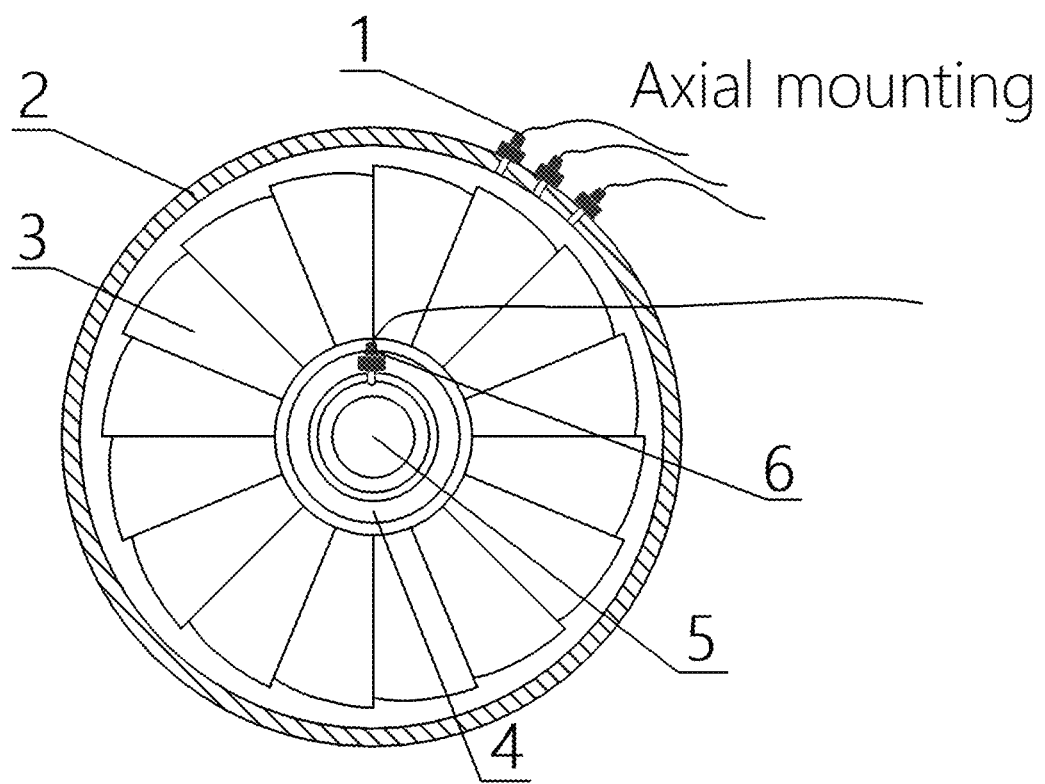
Figure 2C:
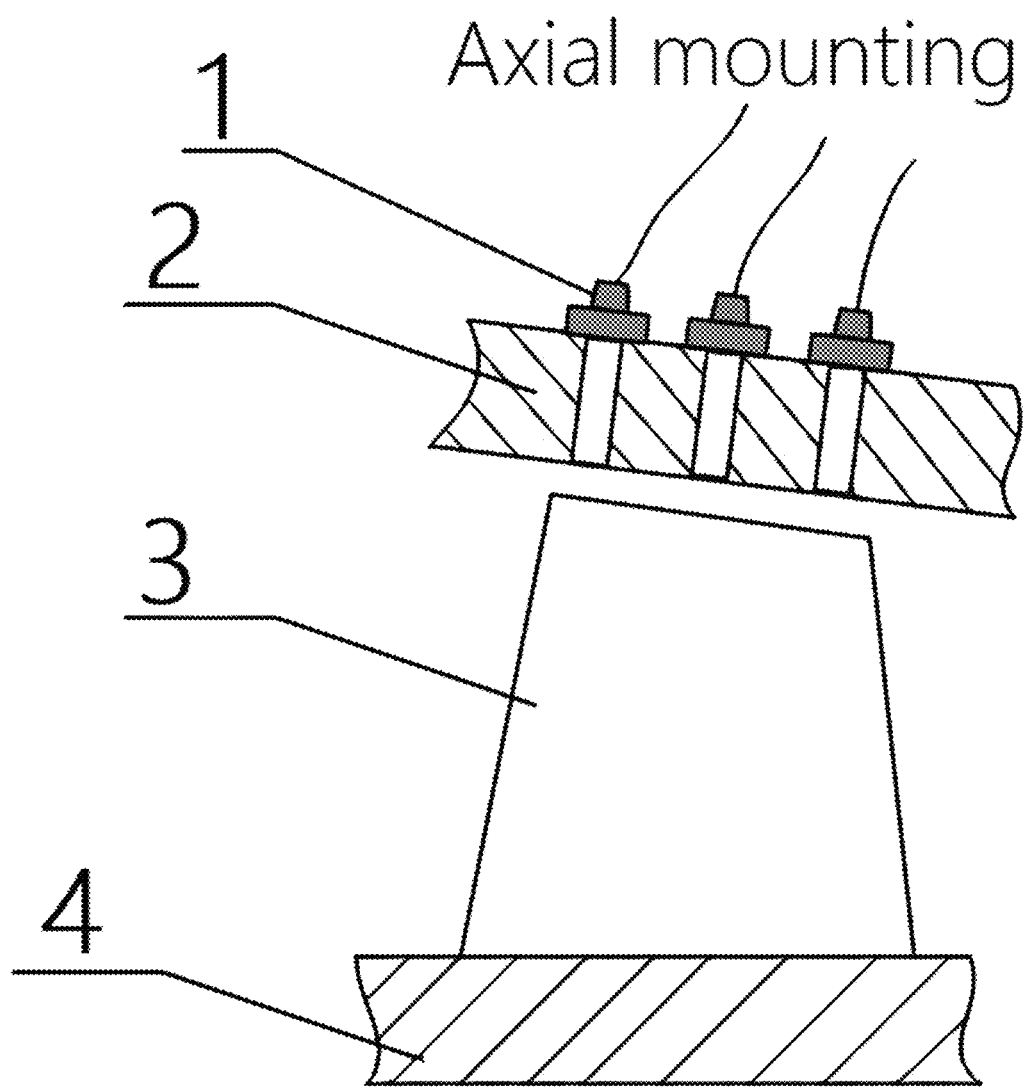
Figure 3:
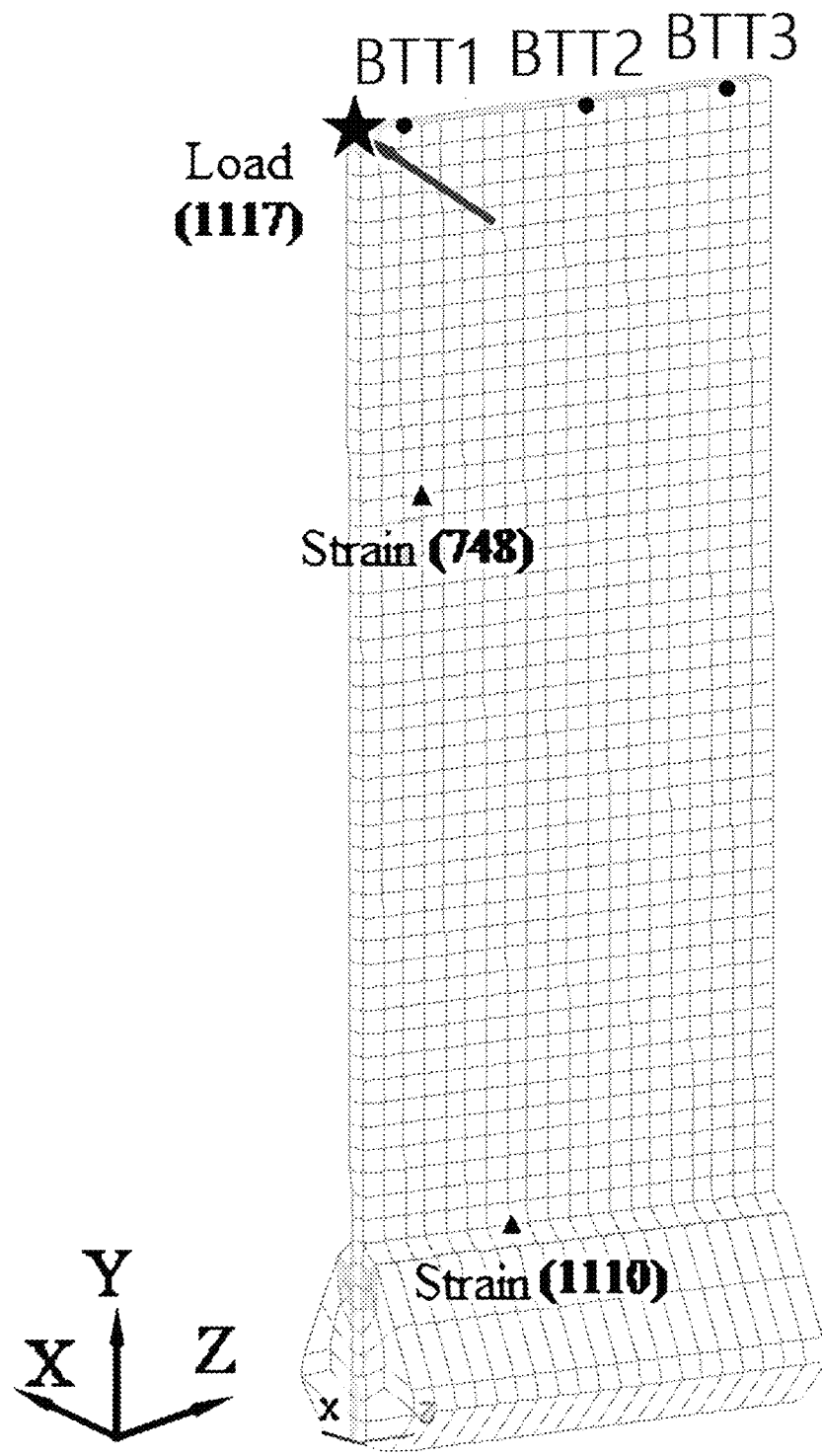
FIG. 3 is a schematic diagram of simulating a dynamic load excitation position of a rotating blade and measuring point positions of blade tip timing sensors (BTT) in one embodiment.
Figure 4A:
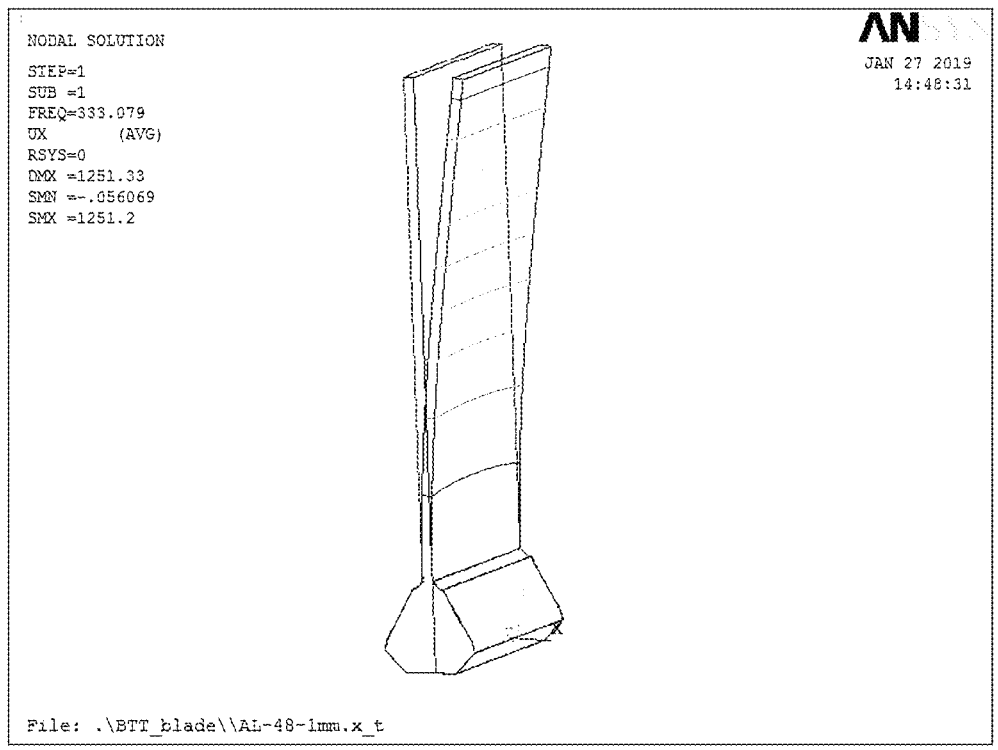
Figure 4B:
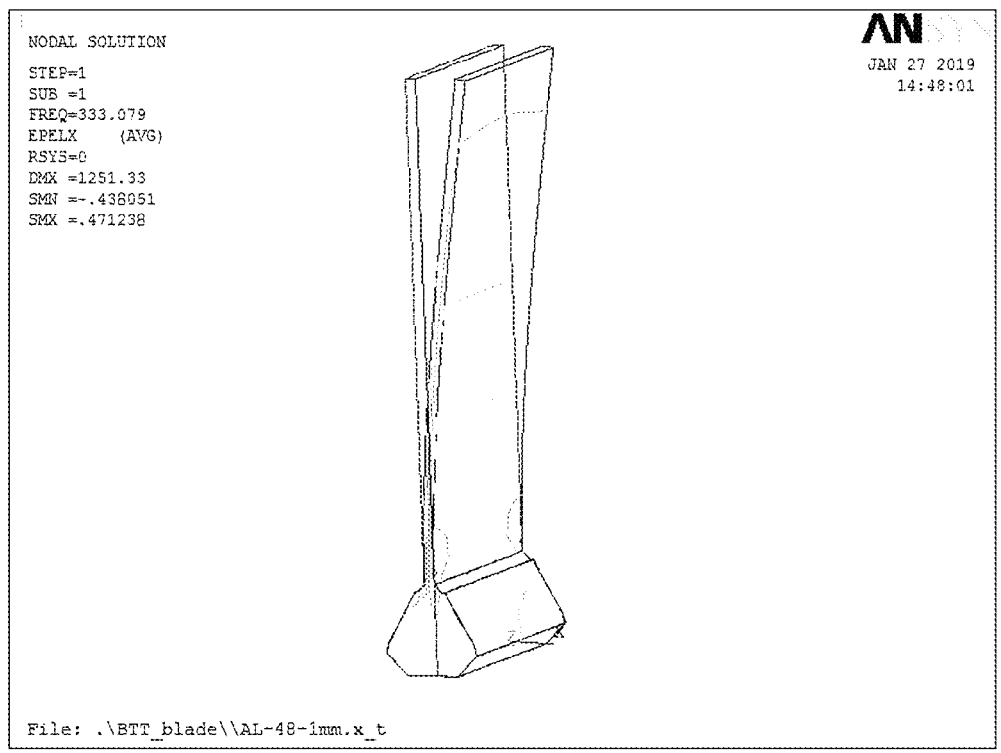
Figure 4C:
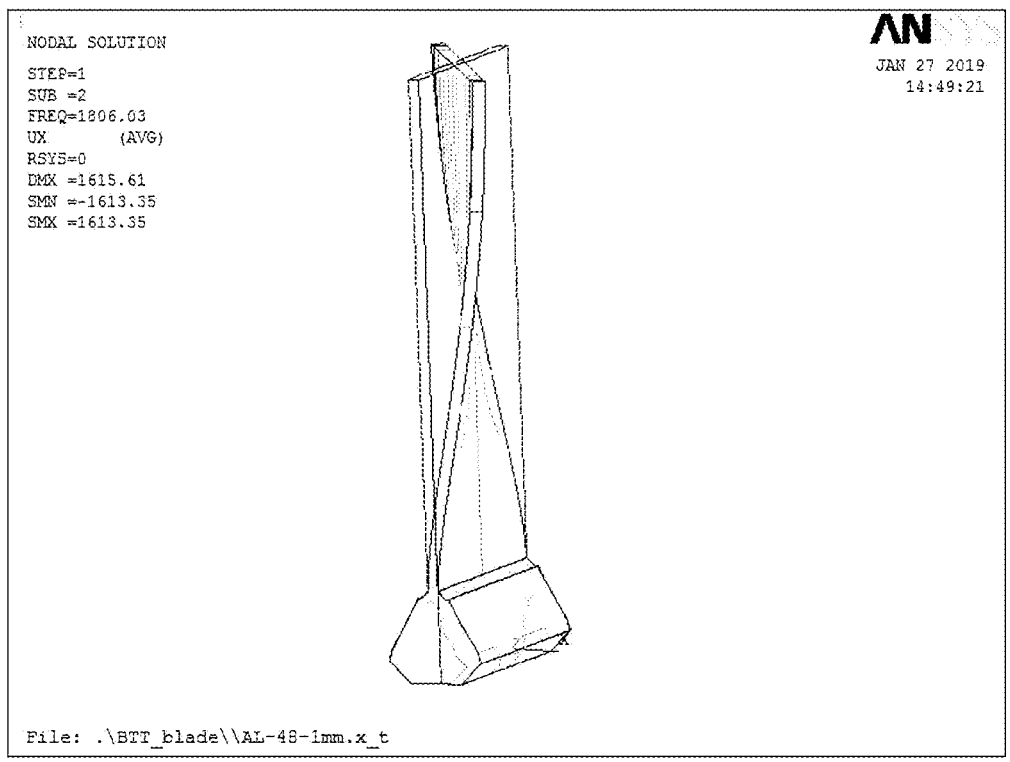
Figure 4D:
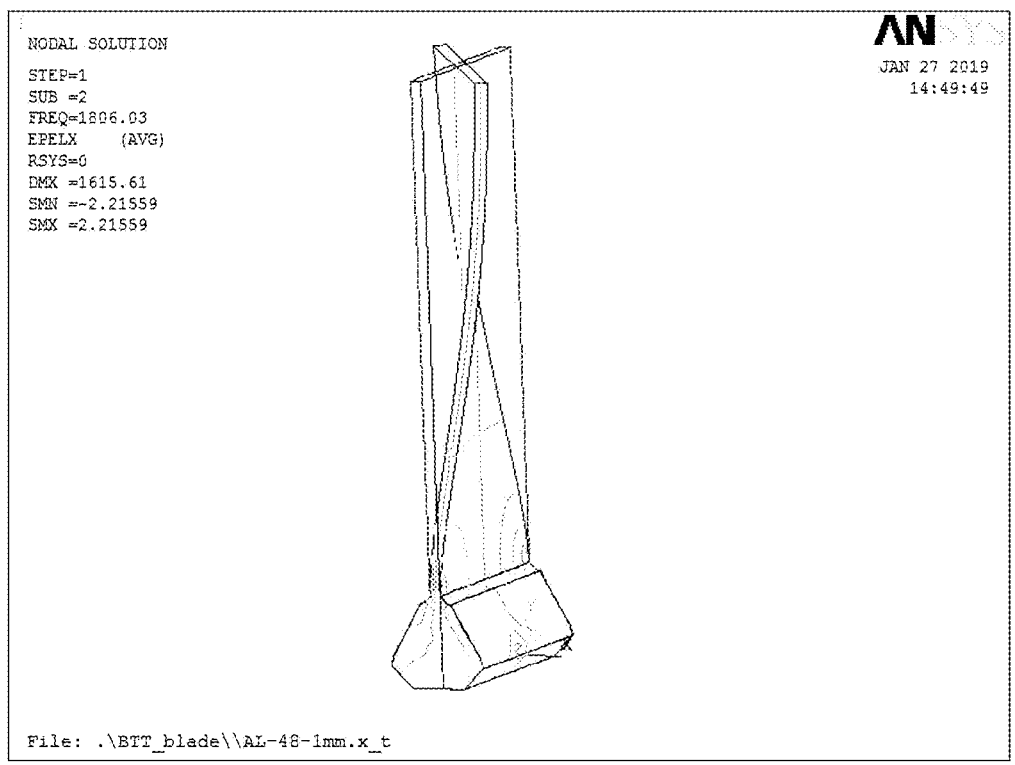
Figure 4E:
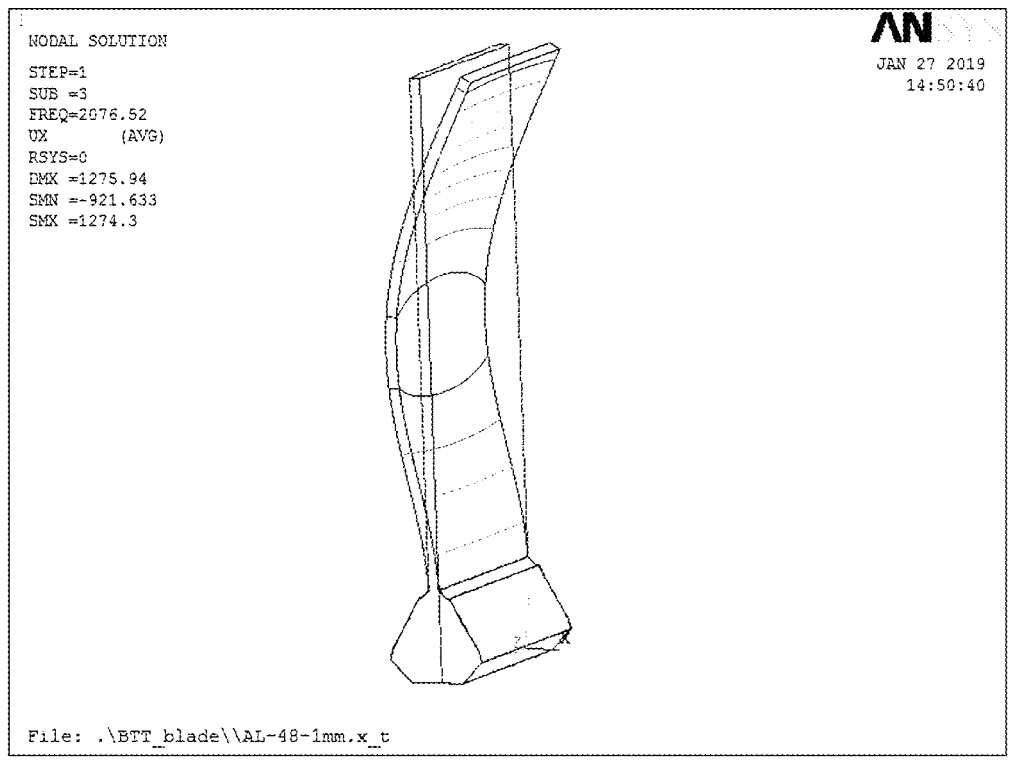
Figure 4F:
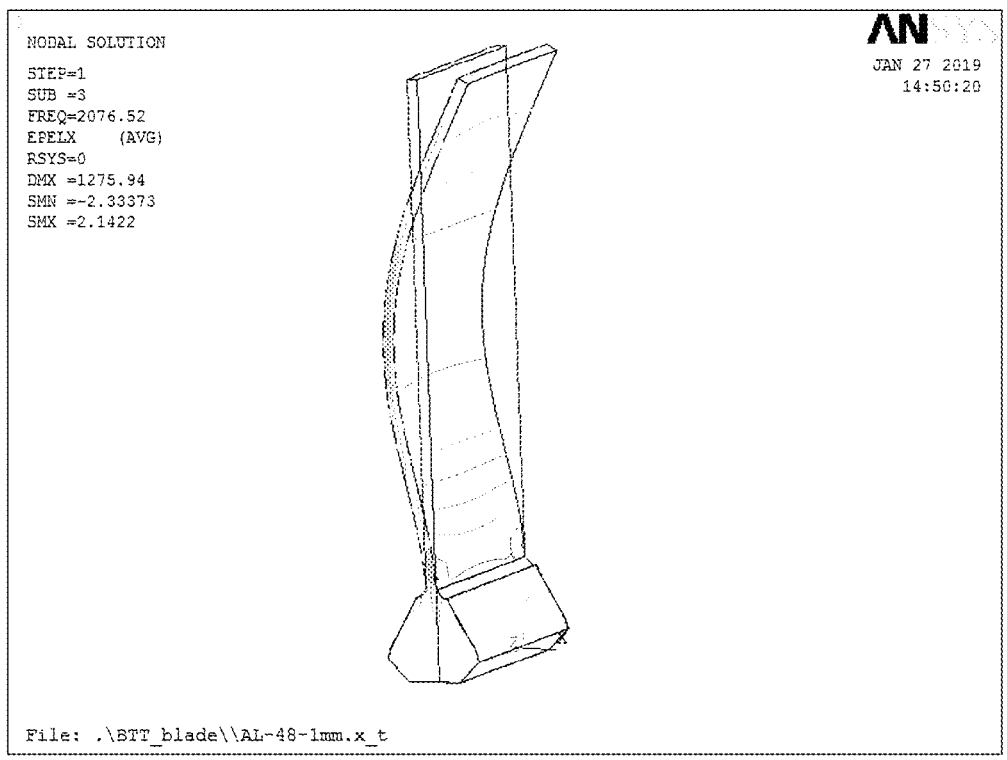

FIG. 1 is a schematic process diagram of a non-contact dynamic strain field measuring method for a rotating blade, completed by the present invention, and according to the method, a conversion relationship between blade tip finite displacement measuring points of the rotating blade and strains of all nodes in a full field is established based on a modal reduction and expansion theory, and the reconstruction of a dynamic strain field of the rotating blade is realized by utilizing little blade tip timing information, FIG. 2(a) to FIG. 2(c) are schematic structural diagrams of a measuring system provided by the present invention, wherein 1—blade tip timing sensor, 2—rotor casing, 3—rotor blade, 4—rotor, 5—wheel disc, and 6—rotating speed sensor. The method includes the specific steps as follows:

1) Modal parameters of a three-dimensional finite element model of a blade are extracted: referring to FIG. 3, a three-dimensional finite element model simulating a straight-panel blade of a rotor is established by utilizing ANSYS finite element analysis software, wherein the three-dimensional finite element model is made of aluminum with the density being 2700 kg/m<3>, the Poisson ratio being 0.33 and the elasticity modulus being 72000 Mpa; the blade has the length of 48 mm, the thickness of 1 mm and the width of 20 mm; a finite element is an entity unit SOLID185 and has 3153 nodes in total; and two side surfaces of a blade root are fixedly restricted to simulate the actual working state of the rotor blade;

first three order modal parameters, namely $n_m=3$: a modal frequency $f_i$, a displacement modal shape $\phi_i$ with the size being $n_{dof} \times 1$ and a strain modal shape $\psi_i$ with the size being $2n_{dof} \times 1$, are extracted by ANSYS modal analysis, wherein first three order modal frequencies are respectively $f_1=333.08$ Hz, $f_2=1806.03$ Hz and $f_3=2076.52$ Hz; and a full-field strain modal shape matrix, $\psi=[\psi_1, \psi_2, \ldots, \psi_{n_m}]$ with the size being $2n_{dof} \times n_m$, of the rotor blade is constructed, and the strain modal shape refers to FIG. 4(a) to FIG. 4(f), wherein i represents for a modal order, $n_{dof}=9459$ represents for the number of degrees of freedom of the finite element model of the blade, $n_{dof}=3n_n$, and $n_n=3153$ represents for the number of nodes of the finite element model of the blade; and strains include six strain components in total, including three positive strains $\varepsilon_x$, $\varepsilon_y$, $\varepsilon_z$ and three shearing strains $\gamma_{xy}$, $\gamma_{yz}$, $\gamma_{xz}$, namely each node has six strain modal shapes.

2) The number and axial mounting positions of blade tip timing sensors are determined: the number $n_d$ of axial blade tip timing measuring points of the rotating blade may not be smaller than the number $n_m$ of concerned modes, namely $n_d \geq n_m$; in the solution, first three order vibration modes of the simulated rotor blade are concerned, and $n_m=3$; the number of the blade tip timing sensors is minimized, namely $n_d=3$;

a displacement modal shape capable of mounting the blade tip timing sensors in an axial direction of a blade tip of the blade is extracted, and a measuring point selection matrix, $\Phi_p=[\phi'_1, \phi'_1, \ldots, \phi'_{n_m}]$ with the size being $n_c \times n_m = 21 \times 3$, about the displacement modal shape is constructed, wherein $n_c=21$ represents for the number of finite element grid nodes of a single-side blade tip of the blade, each node only selects a circumferential displacement modal shape, and an X-axis direction is selected in the solution; and in the solution, the nodes of the blade tip of the rotating blade are nodes [1118:1136, 66, 1117]. $n_d=3$ measuring points are randomly selected from the measuring point selection matrix $\Phi_p$; a measuring point displacement modal shape matrix $\Phi_d$ with the size being $n_d \times n_m = 3 \times 3$ is constructed, and the condition number $\kappa$ of the matrix is calculated; and the random process is repeated for R=200 times, and a measuring point layout solution when the condition number $\kappa$ of the matrix is minimum is selected therefrom. A measuring point optimization result refers to FIG. 3, the selected three measuring points are respectively a No. 1135 node near an air intake side, a No. 1127 node at the midpoint of the blade tip and No. 1119 node near an air exhaust side, and the condition number of the corresponding measuring point displacement modal shape matrix $\Phi_d$ is 208.41.

3) A conversion matrix, $T=\psi\Phi_d^\dagger$ with the size being $2n_{dof} \times n_d = 18918 \times 3$, of the finite measuring point displacement of the blade tip and strains of all nodes in a full-field is constructed, wherein $\Phi_d^\dagger=[\Phi_d^T\Phi_d]^{-1}\Phi_d^T$ represents for the inversion of the measuring point displacement modal shape matrix $\Phi_d$.

Figure 5:
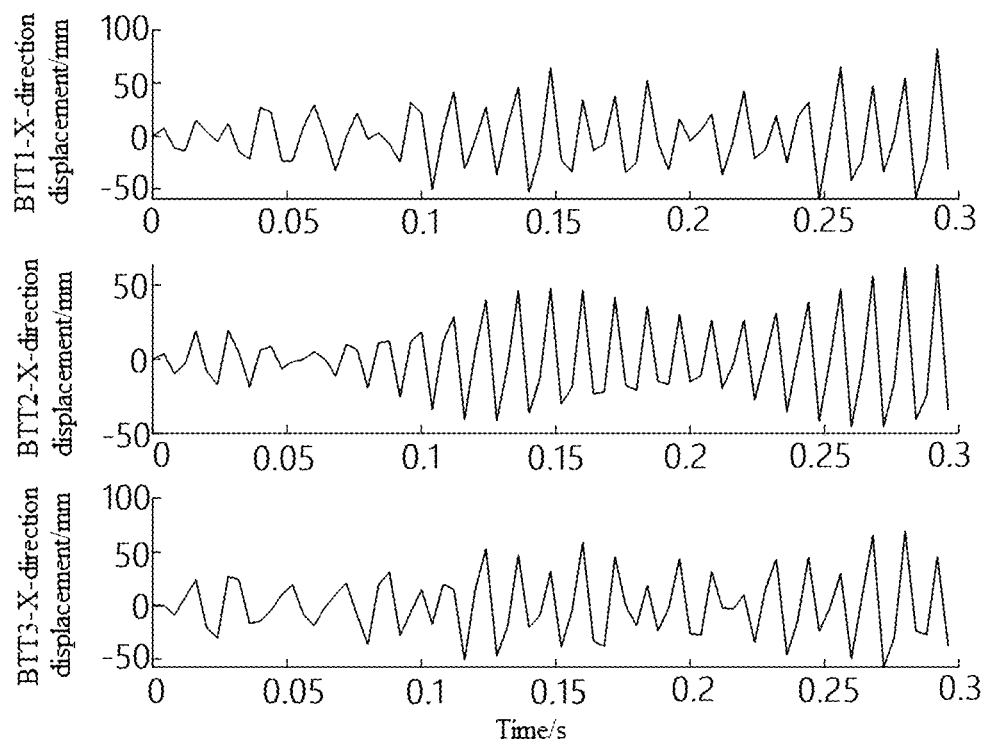
FIG. 5 is blade tip displacement vibration signals actually measured by three blade tip timing sensors of a rotating blade in one embodiment.

4) Blade tip timing vibration measurement is performed: the rotating blade is subjected to transient analysis in the ANSYS finite element software, a mass damping coefficient is set as $\alpha=12.1380$, a stiffness damping coefficient is set as $\beta=8.1986\times10^{-8}$, a rotating speed is set to be 15000 RPM, the multimodal vibration of an aerodynamic load to the rotor blade is simulated, multi-frequency harmonic excitation $f(t)=\cos(2\pi f_1 t)+10\cos(2\pi f_2 t)+20\cos(2\pi f_3 t)$ is applied to an X direction of a No. 1117 node of the blade tip of the rotor blade, and a true strain field of the blade is obtained to be taken as reference of a reconstruction result; in FIG. 3, three blade tip timing sensors acquire an undersampled discrete signal $u(t)=[u_1(t), u_2(t), u_3(t)]^T$ in the axial direction of the blade tip of the rotating blade within the t moments (75 turns), and an actual measurement result refers to FIG. 5, wherein the sampling frequency is $f_s=15000/60=250$ Hz which is same as a rotating speed, the data length of the signal is N=75, and the sampling time is $t=N/f_s=0.3$ s.

5) Positive strains of all nodes on the surface of and inside the rotating blade within the t moments are calculated based on a modal reduction and expansion theory according to a formula $S(t)=Tu(t)$ to obtain $S(t)=[\varepsilon_{1,x},\varepsilon_{1,y},\varepsilon_{1,z},\gamma_{1,xy},\gamma_{1,yz},\gamma_{1,xz}, \ldots, \varepsilon_{i,x},\varepsilon_{i,y},\varepsilon_{i,z},\gamma_{i,xy},\gamma_{i,yz},\gamma_{i,xz}, \ldots, \varepsilon_{n_n,x},\varepsilon_{n_n,y}, \varepsilon_{n_n,z}, \gamma_{n_n,xy},\gamma_{n_n,yz},\gamma_{n_n,xz}]^T$, wherein the strains $S(t)$ include positive strains and shearing strains.

Figure 6A:
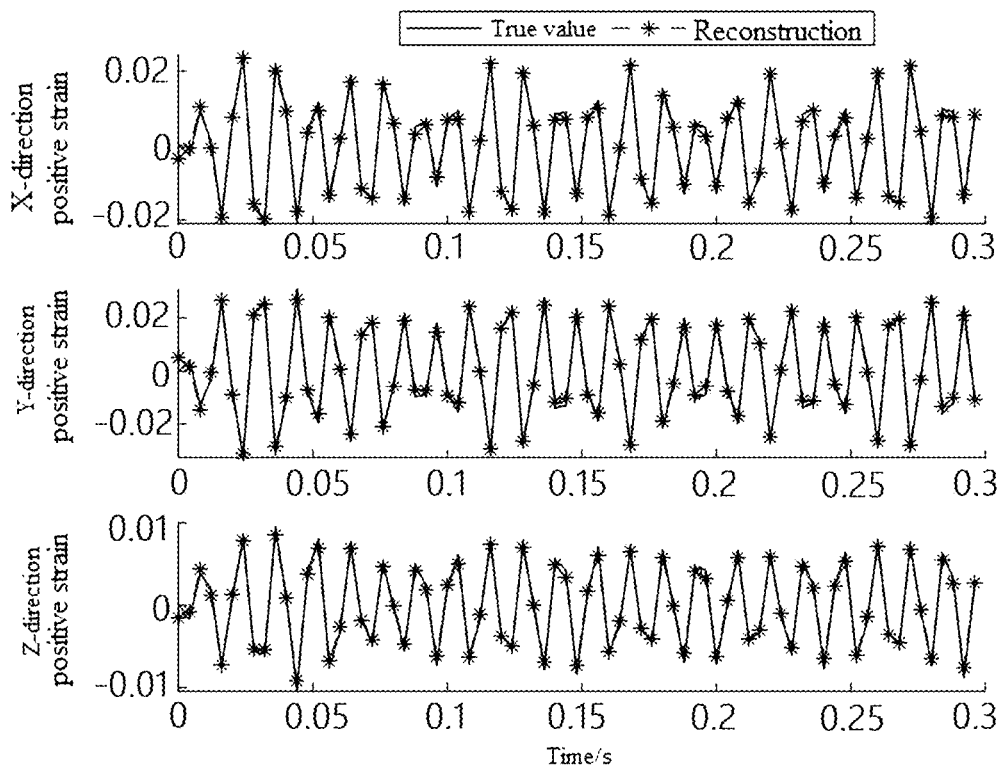
Figure 6B:
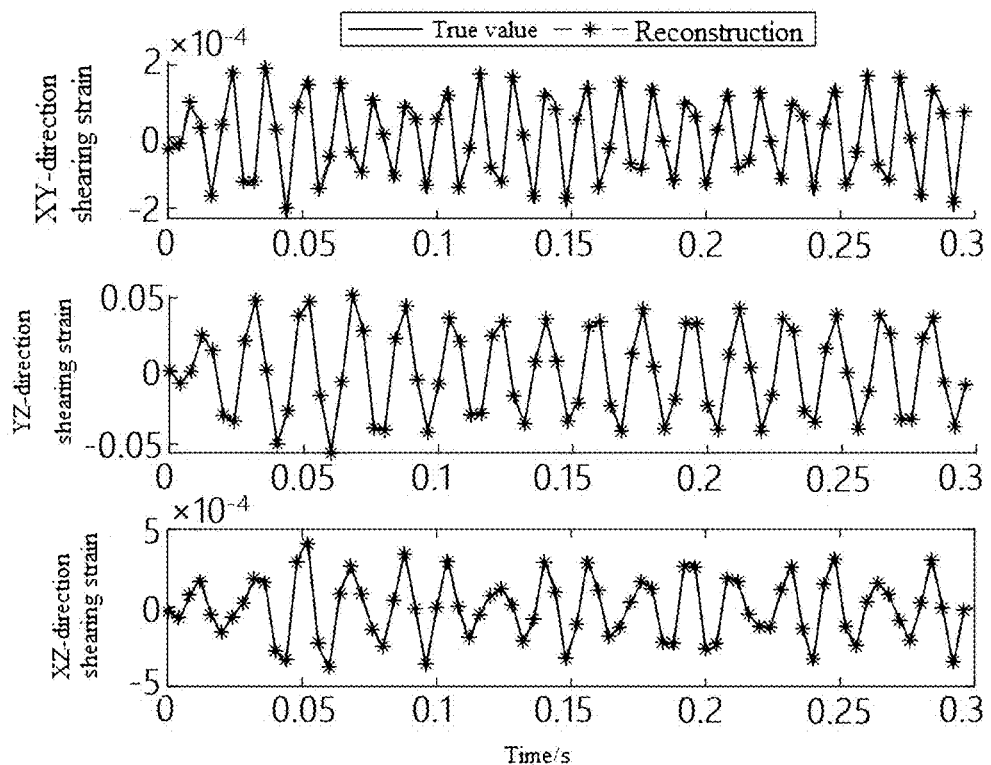
Figure 7A:
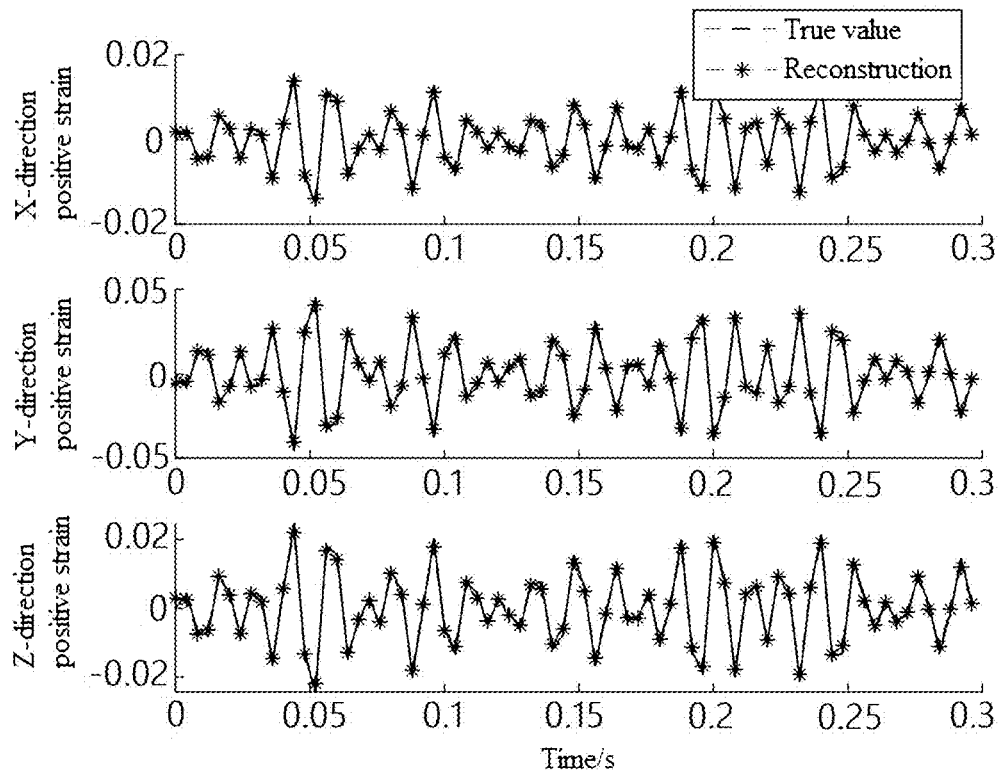
Figure 7B:
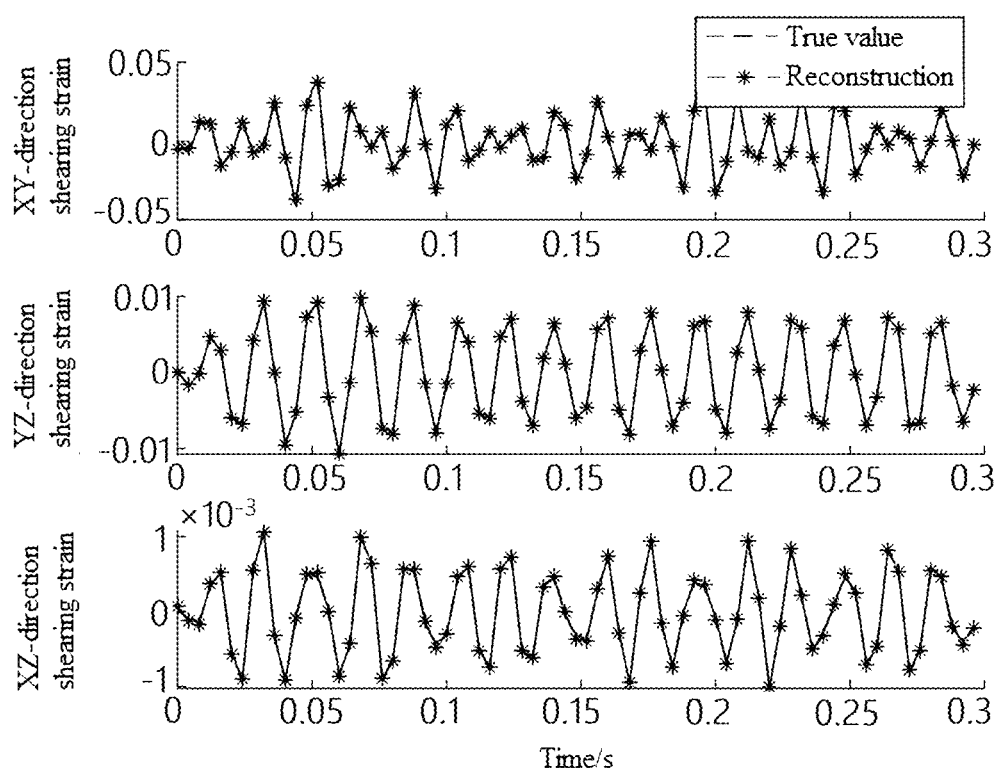

With No. 748 nodes on a blade body and No. 1100 nodes on a blade root of the rotating blade as typical examples of high-precision reconstruction of a dynamic strain field (referring to FIG. 3), the conclusion is also suitable for other nodes. FIG. 6(a) and FIG. 6(b) are comparison results of dynamic strains of the No. 748 nodes on the blade body in a reconstructed strain field of a rotating blade in one embodiment and true dynamic strains; FIG. 7(a) and FIG. 7(b) are comparison results of dynamic strains of the No. 1100 nodes on the blade root in a reconstructed strain field of a rotating blade in one embodiment and true dynamic strains. Known from FIG. 6(a), FIG. 6(b), FIG. 7(a) and FIG. 7(b), a reconstructed dynamic strain signal is highly consistent with the true dynamic strains; in order to quantitatively evaluate the performance of the dynamic strain field measuring method for the rotating blade in the present invention, a relative error of the reconstructed signal and a true strain is calculated within the range $t\in[0, 0.3]$s, relative errors of the three positive strains $\varepsilon_x, \varepsilon_y, \varepsilon_z$ of the No. 748 nodes on the blade body in FIG. 6(a) are respectively 10.76%, 11.35% and 12.35%, and relative errors of the three shearing strains $\gamma_{xy}, \gamma_{yz}, \gamma_{xz}$ of the No. 748 nodes on the blade body in FIG. 6(b) are respectively 12.52%, 2.13% and 8.27%; and relative errors of the three positive strains $\varepsilon_x, \varepsilon_y, \varepsilon_z$ of the No. 1100 nodes on the blade root in FIG. 7(a) are respectively 12.24%, 12.28% and 12.36%, and relative errors of the three shearing strains $\gamma_{xy}, \gamma_{yz}, \gamma_{xz}$ of the No. 1100 nodes on the blade root in FIG. 7(b) are respectively 12.20%, 0.20% and 5.34%. Therefore, the non-contact dynamic strain field measuring method for the rotating blade, provided by the present invention, may be used for high-precision reconstruction of the dynamic strain field of the blade.

According to the method provided by the present invention, the reconstruction of the overall strain field of the rotating blade is realized by only utilizing the blade tip finite measuring point displacement, not only can the measurement of the dynamic strain on the surface of the blade be realized, but also the measurement of the positive strains and the shearing strains of the nodes inside the blade can be realized, and the method is simple in calculation process and online measurement and high in measurement precision. The above descriptions are only preferred embodiments of the present invention, and the measuring method may be applied to vibration tests of fans/gas compressors/turbine blades of rotating machinery such as an aircraft engine, a gas turbine and a steam turbine, but is not intended to limit the present invention.

In another embodiment, the method includes the following steps:
1) modal parameters of a three-dimensional finite element model of a blade are extracted;
2) the number and axial mounting positions of blade tip timing sensors are determined;
3) a conversion matrix of finite measuring point displacement and an overall strain field is constructed;
4) blade tip finite position displacement of the rotating blade is acquired by utilizing the blade tip timing sensors; and
5) dynamic strain measurement of the rotating blade at any moment, on any position and in any direction is realized based on a modal reduction and expansion theory.

Further, in step 1), a finite element model of a rotating blade is established, first $n_m$ order modal parameters: a modal frequency $f_i$, a displacement modal shape $\phi_i$ with the size being $n_{dof}\times1$ and a strain modal shape $\psi_i$ with the size being $2n_{dof}\times1$ are extracted by modal analysis; a full-field displacement modal shape matrix, $\Phi=[\phi_1, \phi_2, \ldots, \phi_{n_m}]$ with the size being $n_{dof}\times n_m$, of the rotating blade and a full-field strain modal shape matrix, $\psi=[\psi_1, \psi_2, \ldots, \psi_{n_m}]$ with the size being $2n_{dof}\times n_m$, of the rotating blade are constructed, i represents for a modal order, and $n_{dof}$ represents for the number of degrees of freedom of the three-dimensional finite element model of the blade; the displacement of each node includes three displacement components $u_x, u_y, u_z$, namely each node has three displacement modal shapes, $n_{dof}=3n_n$, and $n_n$ represents for the number of nodes of the finite element model of the blade; and strains include six strain components in total, including three positive strains $\varepsilon_x, \varepsilon_y, \varepsilon_z$ and three shearing strains $\gamma_{xy}, \gamma_{yz}, \gamma_{xz}$, namely each node has six strain modal shapes.

Further, in step 2), the number $n_d$ of axial blade tip timing measuring points of the rotating blade may not be smaller than the number $n_m$ of concerned modes, namely $n_d \geq n_m$;

a displacement modal shape capable of mounting the blade tip timing sensors in an axial direction of a blade tip of the blade are extracted, and a measuring point selection matrix, $\Phi_p=[\phi'_1, \phi'_1, \ldots, \phi'_{n_m}]$ with the size being $n_c\times n_m$, about the displacement modal shape is constructed, wherein $n_c$ represents for the number of finite element grid nodes of the blade tip of the blade, and each node only selects a circumferential displacement modal shape; and $n_d$ measuring points are randomly selected from the measuring point selection matrix $\Phi_p$, a measuring point displacement modal shape matrix $\Phi_d$ with the size being $n_d\times n_m$ is constructed, and the condition number $\kappa$ of the matrix is calculated; and the random process is repeated for R times, and a measuring point layout solution when the condition number $\kappa$ of the matrix is minimum is selected therefrom.

Further, in step 3), a conversion matrix, $T=\psi\Phi_d^\dagger$ with the size being $2n_{dof}\times n_d$, of the finite measuring point displacement of the blade tip and strains of all nodes in a full-field is constructed, wherein $\Phi_d^\dagger=[\Phi_d^T\Phi_d]^{-1}\Phi_d^T$ represents for the inversion of the measuring point displacement modal shape matrix $\Phi_d$.

Further, in step 4), displacement signals $u(t)=[u_1(t), u_2(t), \ldots, u_{n_d}(t)]^T$ on $n_d$ positions in an axial direction of the rotating blade within t moments are acquired by a blade tip timing non-contact measuring system.

Further, in step 5), strains of all nodes on the surface of and inside the rotating blade within the t moment are calculated based on a modal reduction and expansion theory according to a formula S(t)=Tu(t) to obtain $S(t)=[\varepsilon_{1,x},\varepsilon_{1,y},\varepsilon_{1,z},\gamma_{1,xy},\gamma_{1,yz},\gamma_{1,xz}, \ldots, \varepsilon_{i,x},\varepsilon_{i,y},\varepsilon_{i,z},\gamma_{i,xy},\gamma_{i,yz},\gamma_{i,xz}, \ldots, \varepsilon_{n_n,x},\varepsilon_{n_n,y},\varepsilon_{n_n,z},\gamma_{n_n,xy},\gamma_{n_n,yz},\gamma_{n_n,xz}]^T$, and the strains S(t) include positive strains and shearing strains.

On the other hand, a measuring system for implementing the method includes:

a plurality of blade tip timing sensors arranged on a rotating blade casing;

a blade tip timing vibration measuring module connected with the blade tip timing sensors so as to measure displacement signals $u(t)=[u_1(t), u_2(t), \ldots, u_{n_d}(t)]^T$ on $n_d$ positions in an axial direction of the rotating blade within t moments; and a calculation unit connected with the blade tip timing vibration measuring module, and the calculation unit including:

a modal analysis module configured to perform modal analysis based on a three-dimensional finite element model of a to-be-measured rotating blade so as to acquire a displacement modal shape $\phi_i$ of first $n_m$ order modal frequency $f_i$ of the rotating blade and construct a full-field displacement modal shape matrix $\Phi=[\phi_1, \phi_2, \ldots, \phi_{n_m}]$ of the rotating blade;

a measuring point optimization module configured to optimize the number of measuring points of the blade tip timing sensors arranged on the rotating blade, wherein a measuring point selection matrix $\Phi_p=[\phi'_1, \phi'_1, \ldots, \phi'_{n_m}]$ is constructed based on a displacement modal shape capable of mounting the blade tip timing sensors of the rotating blade, $n_d$ measuring points are randomly selected from the measuring point selection matrix $\Phi_p$ to construct a measuring point displacement modal shape matrix $\Phi_d$ with the size being $n_d \times n_m$, the condition number $\kappa$ of the matrix is calculated, a random process is repeated for R times, and a measuring point layout when the condition number $\kappa$ of the matrix is minimum is selected therefrom;

a conversion matrix calculation module configured to construct a conversion matrix of a finite measuring point displacement of the blade tip and strains of all nodes in a full field; and a strain field reconstruction module configured to calculate strains of all nodes on the surface of and inside the rotating blade within the t moments according to a formula S(t)=Tu(t) to obtain $S(t)=[\varepsilon_{1,x},\varepsilon_{1,y},\varepsilon_{1,z},\gamma_{1,xy},\gamma_{1,yz},\gamma_{1,xz}, \ldots, \varepsilon_{i,x},\varepsilon_{i,y},\varepsilon_{i,z},\gamma_{i,xy},\gamma_{i,yz},\gamma_{i,xz}, \ldots, \varepsilon_{n_n,x},\varepsilon_{n_n,y},\varepsilon_{n_n,z},\gamma_{n_n,xy},\gamma_{n_n,yz},\gamma_{n_n,xz}]^T$, wherein the strains S(t) include positive strains and shearing strains.

In one embodiment, a dynamic strain measuring module includes a remote measuring unit, a slip ring unit and a signal acquisition module.

In one embodiment, a measuring system further includes a display unit and a wireless communication device, and the wireless communication device includes a 4G/GPRS or an internet communication module.

In one embodiment, a modal analysis module, a measuring point optimization module, a conversion matrix calculation module or a dynamic strain field reconstruction module is a general-purpose processor, a digital signal processor, an application-specific integrated circuit ASIC or a field-programmable gate array FPGA.

In one embodiment, a modal analysis module, a measuring point optimization module, a conversion matrix calculation module or a dynamic strain field reconstruction module includes a memory, and the memory includes one or more read-only memories ROM, random access memories RAM, flash memories or electronic erasable programmable read only memories EEPROM.

In one embodiment, a system for the non-contact dynamic strain field measuring method for the rotating blade includes:

a modal analysis module configured to perform modal analysis on a three-dimensional finite element model of a blade by utilizing commercial finite element analysis software to acquire first $n_m$ order modal parameters: a modal frequency $f_i$, a displacement modal shape $\phi_i$ with the size being $n_{dof} \times 1$ and a strain modal shape $\psi_i$ with the size being $2n_{dof} \times 1$; to construct a full-field displacement modal shape matrix, $\Phi=[\phi_1, \phi_2, \ldots, \phi_{n_m}]$ with the size being $n_{dof} \times n_m$, of the rotating blade and a full-field strain modal shape matrix, $\psi=[\psi_1, \psi_2, \ldots, \psi_{n_m}]$ with the size being $2n_{dof} \times n_m$, of the rotating blade, wherein i represents for a modal order, and $n_{dof}$ represents for the number of degrees of freedom of the three-dimensional finite element model of the blade; the displacement of each node includes three displacement components $u_x$, $u_y$, $u_z$, namely each node has three displacement modal shapes, $n_{dof}=3n_n$, and $n_n$ represents for the number of nodes of the finite element model of the blade; and strains include six strain components in total, including three positive strains $\varepsilon_x$, $\varepsilon_y$, $\varepsilon_z$ and three shearing strains $\gamma_{xy}$, $\gamma_{yz}$, $\gamma_{xz}$, namely each node has six strain modal shapes;

a measuring point optimization module configured to determine that the number $n_d$ of axial blade tip timing measuring points of the rotating blade may not be smaller than the number $n_m$ of concerned modes, namely $n_d \geq n_m$; to extract a displacement modal shape capable of mounting the blade tip timing sensors in an axial direction of a blade tip of the blade and construct a measuring point selection matrix, $\Phi_p=[\phi'_1, \phi'_1, \ldots, \phi'_{n_m}]$ with the size being $n_c \times n_m$, about the displacement modal shape, wherein $n_c$ represents for the number of finite element grid nodes of the blade tip of the blade, and each node only selects a circumferential displacement modal shape; to randomly select $n_d$ measuring points from the measuring point selection matrix $\Phi_p$; to construct a measuring point displacement modal shape matrix $\Phi_d$ with the size being $n_d \times n_m$ and calculate the condition number $\kappa$ of the matrix; and to repeat the random process for R times and select a measuring point layout solution therefrom when the condition number $\kappa$ of the matrix is minimum;

a conversion matrix calculation module configured to construct a conversion matrix, $T=\psi\Phi_d^\dagger$ with the size being $2n_{dof} \times n_d$, of the finite measuring point displacement of the blade tip and strains of all nodes in a full-field, wherein $\Phi_d^\dagger=[\Phi_d^T\Phi_d]^{-1}\Phi_d^T$ represents for the inversion of the measuring point displacement modal shape matrix $\Phi_d$;

a blade tip timing vibration measuring module including a plurality of blade tip timing sensors and a signal acquisition module; and being configured to acquire displacement signals $u(t)=[u_1(t), u_2(t), \ldots, u_{n_d}(t)]^T$ on $n_d$ positions in an axial direction of the rotating blade within t moments by a blade tip timing non-contact measuring system; and a strain field reconstruction module configured to calculate strains of all nodes on the surface of and inside the rotor blade within t moments according to a formula S(t)=Tu(t) to obtain $S(t)=[\varepsilon_{1,x},\varepsilon_{1,y},\varepsilon_{1,z},\gamma_{1,xy},\gamma_{1,yz},\gamma_{1,xz}, \ldots, \varepsilon_{i,x},\varepsilon_{i,y},\varepsilon_{i,z},\gamma_{i,xy},\gamma_{i,yz},\gamma_{i,xz}, \ldots, \varepsilon_{n_n,x},\varepsilon_{n_n,y},$ $\varepsilon_{n_n,z},\gamma_{n_n,xy},\gamma_{n_n,yz},\gamma_{n_n,xz}]^T$, wherein the strains S(t) include positive strains and shearing strains.

Although implementation solutions of the present invention are described above in combination with the accompanying drawings, the present invention is not limited to the above-mentioned specific implementation solutions and application fields, and the above-mentioned specific implementation solutions are only schematic and instructive instead of restrictive. Many forms can also be made by the ordinary skilled in the art under the enlightenment of the specification and without departing from the protective scope of the claims of the present invention, and all the forms fall within the protective scope of the present invention.

The invention claimed is:

1. A non-contact dynamic strain field measuring method for a rotating blade, comprising the following steps:

in the first step (S1), determining a to-be-measured rotating blade, and establishing a three-dimensional finite element model of the to-be-measured rotating blade, and extracting modal parameters of the three-dimensional finite element model, in the first step S1, first $n_m$ order modal parameters: a modal frequency $f_i$, a displacement modal shape $\phi_i$ with the size being $n_{dof} \times 1$ and a strain modal shape $\psi_i$ with the size being $2n_{dof} \times 1$, of the three-dimensional finite element model are extracted by modal analysis, and a full-field displacement modal shape matrix, $\Phi=[\phi_1, \phi_2, \ldots, \phi_{n_m}]$ with the size being $n_{dof} \times n_m$, of the rotating blade and a full-field strain modal shape matrix, $\psi=[\psi_1, \psi_2, \ldots, \psi_{n_m}]$ with the size being $2n_{dof} \times n_m$, of the rotating blade are constructed, wherein $n_m$ represents for a modal number, i represents for a modal order, $n_{dof}$ represents for the number of degrees of freedom of the finite element model of the rotating blade, $n_{dof}=3n_n$, and $n_n$ represents for the number of nodes of the finite element model of the rotating blade;

in the second step (S2), determining the number and axial mounting positions of blade tip timing sensors, wherein a measuring point selection matrix $\Phi_p=[\phi'_1, \phi'_1, \ldots, \phi'_{n_m}]$ is constructed based on a displacement modal shape capable of mounting the blade tip timing sensors of the rotating blade, $n_d$ measuring points are randomly selected from the measuring point selection matrix $\Phi_p$ to construct a measuring point displacement modal shape matrix $\Phi_d$ with the size being $n_d \times n_m$, the condition number κ of the matrix is calculated, a random process is repeated for R times, and a measuring point layout when the condition number κ of the matrix is minimum is selected therefrom; the number $n_d$ of axial blade tip timing measuring points of the rotating blade is not be smaller than the number $n_m$ of concerned modes, namely $n_d \geq n_m$; in a solution, first three order vibration modes of the simulated rotor blade are concerned, and $n_m=3$; the number of the blade tip timing sensors is minimized, namely $n_d=3$, thus yielding a minimized number of the blade tip timing sensors;

in the second step S2, a displacement modal shape capable of mounting the blade tip timing sensors in an axial direction of a blade tip of the blade is extracted, wherein $n_c$ represents for the number of finite element grid nodes of the blade tip of the blade, and each node selects a circumferential displacement modal shape;

in the third step (S3), constructing a conversion matrix of finite measuring point displacement and an overall strain field, wherein in the third step S3, a conversion matrix $T=\psi \Phi_d^\dagger$ with the size being $2n_{dof} \times n_d$ is constructed, wherein $\Phi_d^\dagger=[\Phi_d^T \Phi_d]^{-1} \Phi_d^T$ represents for an inversion of the measuring point displacement modal shape matrix $\Phi_d$;

in the fourth step (S4), disposing the minimized number of the blade tip timing sensors close to an inner side of the casing; performing displacement measurement by a blade tip timing vibration measuring module connected with the minimum number of the blade tip timing sensors and acquiring blade tip finite position displacement of the rotating blade based on the blade tip timing sensors, wherein displacement signals $u(t)=[u_1(t), u_2(t), \ldots, u_{n_d}(t)]^T$ on $n_d$ positions in an axial direction of the rotating blade within t moments are acquired by a blade tip timing non-contact measuring system; and in the fifth step (S5), acquiring, by a dynamic strain, dynamic strains of the rotating blade at any moment, on any position and in any direction based on modal processing of the conversion matrix, wherein in the fifth step (S5), based on the conversion matrix T and the displacement signals u(t) measured by blade tip timing, strains of all nodes on a surface of and inside the rotating blade within the t moment are calculated according to a formula $S(t)=Tu(t)$ to obtain $S(t)=[\varepsilon_{1,x}, \varepsilon_{1,y}, \varepsilon_{1,z}, \gamma_{1,xy}, \gamma_{1,yz}, \gamma_{1,xz}, \ldots, \varepsilon_{i,x}, \varepsilon_{i,y}, \varepsilon_{i,z}, \gamma_{i,xy}, \gamma_{i,yz}, \gamma_{i,xz}, \ldots, \varepsilon_{n_n,x}, \varepsilon_{n_n,y}, \varepsilon_{n_n,z}, \gamma_{n_n,xy}, \gamma_{n_n,yz}, \gamma_{n_n,xz}]^T$, and the strains S(t) comprise positive strains and shearing strains, wherein $\varepsilon_{i,x}$ represents for a positive strain of the $i^{th}$ node of the finite element model of the blade in an x direction, $\varepsilon_{i,y}$ represents for a positive strain of the $i^{th}$ node of the finite element model of the blade in a y direction, $\varepsilon_{i,z}$ represents for a positive strain of the $i^{th}$ node of the finite element model of the blade in a z direction, $\gamma_{i,xy}$ represents for a shearing strain of the $i^{th}$ node of the finite element model of the blade in an x-y direction, $\gamma_{i,yz}$ represents for a shearing strain of the $i^{th}$ node of the finite element model of the blade in a y-z direction, and $\gamma_{i,xz}$ represents for a shearing strain of the $i^{th}$ node of the finite element model of the blade in an x-z direction, thus realizing reconstruction of the overall strain field of the rotating blade by only utilizing the blade tip finite measuring point displacement, wherein not only is the measurement of the dynamic strain on the surface of the blade realized, but also the measurement of the positive strains and the shearing strains of the nodes inside the blade is realized;

wherein a plurality of blade tip timing sensors are arranged on the casing; a blade tip timing vibration measuring module connected with the blade tip timing sensors so as to measure displacement signals $u(t)=[u_1(t), u_2(t), \ldots, u_{n_d}(t)]^T$ on $n_d$ positions in an axial direction of the rotating blade within t moments; and a strain field reconstruction module configured to calculate the strains of all the nodes on the surface of and inside the rotor blade within t moments according to a formula $S(t)=Tu(t)$ to obtain $S(t)=[\varepsilon_{1,x}, \varepsilon_{1,y}, \varepsilon_{1,z}, \gamma_{1,xy}, \gamma_{1,yz}, \gamma_{1,xz}, \ldots, \varepsilon_{i,x}, \varepsilon_{i,y}, \varepsilon_{i,z}, \gamma_{i,xy}, \gamma_{i,yz}, \gamma_{i,xz}, \ldots, \varepsilon_{n_n,x}, \varepsilon_{n_n,y}, \varepsilon_{n_n,z}, \gamma_{n_n,xy}, \gamma_{n_n,yz}, \gamma_{n_n,xz}]^T$, wherein the strains S(t) include positive strains and shearing strains, thus reconstructing dynamic strains of all the nodes on the surface of and inside the rotating blade and enhancing reliability of obtaining dynamic strains of the with the rotating blade finite positions of finite blades with the minimum number of the blade tip timing sensors.

2. The method according to claim 1, wherein in the first step (S1), strains of each node of the finite element model of the rotating blade comprise six strain components in total, comprising three positive strains $\varepsilon_x$, $\varepsilon_y$, $\varepsilon_z$ and three shearing strains $\gamma_{xy}$, $\gamma_{yz}$, $\gamma_{xz}$.

3. A measuring system for implementing the method according to claim 1, comprising:
- a calculation unit connected with the blade tip timing vibration measuring module, and the calculation unit comprising:
- a modal analysis module configured to perform modal analysis based on a three-dimensional finite element model of a to-be-measured rotating blade so as to acquire a displacement modal shape $\Phi_i$ of first $n_m$ order modal frequency $f_i$ of the rotating blade and construct a full-field displacement modal shape matrix $\Phi=[\phi_1, \phi_2, \ldots, \phi_{n_m}]$ of the rotating blade;
- a measuring point optimization module configured to optimize the number of measuring points of the blade tip timing sensors arranged on the rotating blade;
- a conversion matrix calculation module configured to construct a conversion matrix of finite measuring point displacement of the blade tip and strains of all nodes in a full field; and
- a strain field reconstruction module configured to calculate strains of all nodes on the surface of and inside the rotating blade within the t moments according to a formula $S(t)=Tu(t)$ to obtain $S(t)=[\varepsilon_{1,x},\varepsilon_{1,y},\varepsilon_{1,z},\gamma_{1,xy},\gamma_{1,yz},\gamma_{1,xz}, \ldots, \varepsilon_{i,x},\varepsilon_{i,y},\varepsilon_{i,z},\gamma_{i,xy},\gamma_{i,yz},\gamma_{i,xz}, \ldots, \varepsilon_{n_n,x},\varepsilon_{n_n,y},\varepsilon_{n_n,z},\gamma_{n_n,xy},\gamma_{n_n,yz},\gamma_{n_n,xz}]^T$, wherein the strains $S(t)$ comprise positive strains and shearing strains.

4. The measuring system for implementing the method according to claim 3, wherein in the first step (S1), strains of each node of the finite element model of the rotating blade comprise six strain components in total, comprising three positive strains $\varepsilon_x$, $\varepsilon_y$, $\varepsilon_z$ and three shearing strains $\gamma_{xy}$, $\gamma_{yz}$, $\gamma_{xz}$.

* * * * *